(12) United States Patent
Biwa et al.

(10) Patent No.: US 7,067,339 B2
(45) Date of Patent: Jun. 27, 2006

(54) SELECTIVE GROWTH METHOD, AND SEMICONDUCTOR LIGHT EMITTING DEVICE AND FABRICATION METHOD THEREOF

(75) Inventors: Goshi Biwa, Kanagawa (JP); Hiroyuki Okuyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/144,565

(22) Filed: Jun. 3, 2005

(65) Prior Publication Data

US 2005/0221593 A1  Oct. 6, 2005

Related U.S. Application Data

(62) Division of application No. 10/341,827, filed on Jan. 14, 2003, now Pat. No. 6,969,670.

(30) Foreign Application Priority Data

Jan. 17, 2002  (JP) ............................. 2002-009285

(51) Int. Cl.
*H01L 21/00* (2006.01)
(52) U.S. Cl. .......................................... 438/39; 438/46
(58) Field of Classification Search ................ 438/479, 438/481, 488, 503, 930, 974, 46, 47, 31, 438/39, 40; 117/88, 89, 90, 94, 95, 104, 117/105, 106, 952
See application file for complete search history.

(56) References Cited

U.S. PATENT DOCUMENTS

| | | | |
|---|---|---|---|
| 4,526,624 A | | 7/1985 | Tombrello et al. |
| 5,250,462 A | * | 10/1993 | Sasaki et al. .................. 437/89 |
| 5,438,241 A | | 8/1995 | Zavracky et al. |
| 5,659,565 A | * | 8/1997 | Kitamura ...................... 372/43 |
| 5,790,580 A | * | 8/1998 | Sakata et al. .................. 372/50 |
| 5,834,327 A | | 11/1998 | Yamazaki et al. |
| 5,989,944 A | | 11/1999 | Yoon |
| 6,030,849 A | * | 2/2000 | Hasegawa et al. ............. 438/46 |
| 6,084,901 A | * | 7/2000 | Suzuki ......................... 372/96 |
| 6,110,813 A | | 8/2000 | Ota et al. |
| 6,111,277 A | | 8/2000 | Ikeda |
| 6,204,079 B1 | | 3/2001 | Aspar et al. |
| 6,252,261 B1 | * | 6/2001 | Usui et al. ................... 257/190 |
| 6,274,889 B1 | | 8/2001 | Ota et al. |

(Continued)

FOREIGN PATENT DOCUMENTS

JP  2000-058461 A  2/2000

(Continued)

*Primary Examiner*—M. Wilczewski
(74) *Attorney, Agent, or Firm*—Robert J. Depke; Trexler, Bushnell, Giangiorgi, Blackstone & Marr, Ltd.

(57) ABSTRACT

At the time of selective growth of an active layer on a substrate, crystal is previously grown in an active layer non-growth region, and the active layer is grown in an active layer selective growth region. With this configuration, a source supplied to the non-growth region is incorporated in the deposited crystal from the initial stage of growth, so that the supplied amount of the source to the active layer selective growth region is kept nearly at a constant value over the entire period of growth of the active layer, to eliminate degradation of characteristics of the device due to a variation in growth rate of the active layer. In particular, the selective growth method is effective in fabrication of a semiconductor light emitting device including a cladding layer, a guide layer, and an active layer, each of which is formed by selective growth, wherein the active layer has multiple quantum wells.

6 Claims, 7 Drawing Sheets

U.S. PATENT DOCUMENTS

| | | |
|---|---|---|
| 6,277,711 B1 | 8/2001 | Wu |
| 6,316,357 B1 | 11/2001 | Lin et al. |
| 6,320,209 B1* | 11/2001 | Hata et al. .................. 257/190 |
| 6,325,850 B1* | 12/2001 | Beaumont et al. ............. 117/95 |
| 6,403,451 B1* | 6/2002 | Linthicum et al. .......... 438/479 |
| 6,576,571 B1* | 6/2003 | Biwa et al. .................. 438/791 |
| 6,583,445 B1 | 6/2003 | Reedy et al. |
| 6,586,778 B1* | 7/2003 | Linthicum et al. .......... 257/103 |
| 6,589,806 B1* | 7/2003 | Sasaki ........................ 438/31 |
| 6,610,144 B1* | 8/2003 | Mishra et al. ................ 117/95 |
| 6,613,610 B1 | 9/2003 | Iwafuchi et al. |
| RE38,466 E | 3/2004 | Inoue et al. |
| 6,858,081 B1* | 2/2005 | Biwa et al. .................. 117/89 |
| 6,881,982 B1* | 4/2005 | Okuyama et al. ............. 257/91 |
| 6,924,500 B1* | 8/2005 | Okuyama et al. ............. 257/13 |
| 2001/0019568 A1* | 9/2001 | Sakata ........................ 372/50 |
| 2002/0027934 A1* | 3/2002 | Sasaki ........................ 372/45 |
| 2002/0043208 A1* | 4/2002 | Biwa et al. ................... 117/94 |
| 2002/0117677 A1* | 8/2002 | Okuyama et al. ............. 257/94 |
| 2002/0155712 A1* | 10/2002 | Urashima et al. ........... 438/689 |
| 2002/0168844 A1* | 11/2002 | Kuramoto et al. .......... 438/604 |
| 2003/0107047 A1* | 6/2003 | Okuyama et al. .............. 257/95 |
| 2003/0138983 A1* | 7/2003 | Biwa et al. .................... 438/46 |
| 2003/0140846 A1* | 7/2003 | Biwa et al. .................... 117/89 |
| 2003/0160249 A1* | 8/2003 | Sakata ........................... 257/79 |
| 2003/0168666 A1* | 9/2003 | Okuyama et al. .............. 257/80 |
| 2003/0207551 A1* | 11/2003 | Gehrke et al. .............. 438/584 |
| 2004/0029365 A1* | 2/2004 | Linthicum et al. .......... 438/481 |
| 2005/0145859 A1* | 7/2005 | Okuyama et al. .............. 257/81 |
| 2005/0167675 A1* | 8/2005 | Okuyama et al. .............. 257/77 |
| 2005/0167676 A1* | 8/2005 | Okuyama et al. .............. 257/77 |
| 2005/0167677 A1* | 8/2005 | Okuyama et al. .............. 257/77 |
| 2005/0167678 A1* | 8/2005 | Okuyama et al. .............. 257/77 |
| 2005/0170538 A1* | 8/2005 | Okuyama et al. .............. 438/22 |
| 2005/0179025 A1* | 8/2005 | Okuyama et al. .............. 257/13 |

FOREIGN PATENT DOCUMENTS

| | | | |
|---|---|---|---|
| JP | 2000-58981 | * | 2/2000 |
| JP | 2000-174391 A | | 6/2000 |
| JP | 2001-102315 A | | 4/2001 |
| JP | 2003-218393 | * | 7/2003 |

* cited by examiner

SELECTIVE GROWTH METHOD, AND SEMICONDUCTOR LIGHT EMITTING DEVICE AND FABRICATION METHOD THEREOF

The subject matter of application Ser. No. 10/341,827 is incorporated herein by reference. The present application is a divisional of U.S. application Ser. No. 10/341,827, filed Jan. 14, 2003 now U.S. Pat. No. 6,969,670, which claims priority to Japanese Patent Application No. JP2002-009285, filed Jan. 17, 2002. The present application claims priority to these previously filed applications.

BACKGROUND OF THE INVENTION

The present invention relates to a selective growth method, and to a semiconductor light emitting device and a fabrication method thereof, to each of which the selective growth method is applied.

GaN based compound semiconductors have become a focus of attention as semiconductor materials for semiconductor light emitting devices, and a variety of device designs and trials have been made to improve characteristics of semiconductor light emitting devices using GaN based compound semiconductors.

The GaN based semiconductor light emitting device emits light having a wavelength in a short-wavelength region, and therefore, it allows emission of light of blue or green. Accordingly, a full-color image display unit can be fabricated, for example, by combining the GaN based semiconductor light emitting devices with GaAs based semiconductor light emitting devices allowing emission of light of red.

The above-described GaN based semiconductor light emitting device can be fabricated by forming a mask having an opening on a sapphire substrate, forming a nitride layer by selective growth from the opening, and sequentially forming a cladding layer, a guide layer, and an active layer on a tilt growth plane of the nitride layer by selective growth. Such a light emitting device is excellent in luminous efficiency.

In the step of selective growth of the active layer in the above-described fabrication method, it is required to grow the active layer at a low temperature, and such growth of the active layer causes a problem that the growth rate is reduced with an increase in thickness of the active layer, and the repeatability of fabrication is also degraded. For example, in the case of forming an active layer of a multi-layer structure having multiple quantum wells, there occurs a phenomenon that the growth rate of the active layer becomes gradually low and thereby the thickness of the quantum well becomes gradually thin. In a light emitting device including an active layer of the multi-quantum well structure, to ensure excellent light emission characteristics, it is preferred that the thickness of one of the multiple quantum wells is equal to that of another of the multiple quantum wells. If the thickness of the quantum well becomes gradually thin, characteristics of the device are degraded, and more specifically, a half-value width of an emission wavelength peak becomes large, and the repeatability of fabrication is also degraded.

SUMMARY OF THE INVENTION

An object of the present invention is to provide a selective growth method capable of solving a problem associated with degradation of characteristics due to a variation in growth rate of an active layer.

Another object of the present invention is to provide a semiconductor light emitting device and a fabrication method thereof, which are capable of improving characteristics, for example, reducing a half-value width of an emission wavelength peak.

The present inventors have examined to achieve the above objects, and found the following knowledge.

In the case of forming an active layer at a low temperature by selective crystal growth, the amount of deposition on a mask as an active layer non-growth region is increased with an increase in thickness of the active layer as the low temperature layer, and along the increased amount of the deposition on the mask, the supplied amount of a source to a device growth region, that is, an active layer selective growth region is reduced. As a result, if the growth of the active layer begins in a state with no deposition on the mask, the growth rate becomes gradually low. As a result, the thickness of the active layer becomes gradually thin, and the repeatability of fabrication is also degraded.

The present invention has been accomplished on the basis of such knowledge.

According to a first aspect of the present invention, there is provided a selective growth method for selectively growing an active layer on a substrate, including the steps of previously growing crystal in an active layer non-growth region, and growing an active layer in an active layer selective growth region.

As described above, if deposition (crystal) is present in the non-growth region (mask), the source supplied to the non-growth region is incorporated in the crystal, with a result that the supplied amount of the source to the active layer selective growth region is reduced.

In the case where the growth of the active layer begins in a state with no deposition in the non-growth region, in the initial stage, since all of the source is substantially supplied to the active layer selective growth region, the supplied amount of the source to the active layer selective growth region is large; however, in the later stage, since deposition is formed in the non-growth region with elapsed time, the source is partially incorporated in the deposition, with a result that the supplied amount of the source to the active layer selective growth region is reduced. On the contrary, in the case where the growth of the active layer begins in a state in which deposition is already formed in the non-growth region, the source supplied to the non-growth region is incorporated in the deposition from the initial stage of growth, so that the supplied amount of the source to the active layer selective growth region is kept nearly at a constant value. As a result, it is possible to keep the growth rate of the active layer constant, and hence to eliminate a variation in thickness of the active layer.

According to a second aspect of the present invention, there is provided a semiconductor light emitting device including a cladding layer, a guide layer, and an active layer, each of which is formed by selective growth, wherein the active layer has multiple quantum wells, and the thickness of one of the multiple quantum wells is nearly equal to that of another of the multiple quantum wells.

According to a third aspect of the present invention, there is provided a method of fabricating a semiconductor light emitting device including a cladding layer, a guide layer, and an active layer, each of which is sequentially formed by selective growth, the method including the steps of previously growing crystal in an active layer non-growth region, and growing the active layer in an active layer selective growth region.

According to the semiconductor light emitting device of the present invention, since the active layer formed by selective growth has multiple quantum wells and the thickness of one of the multiple quantum wells is nearly equal to that of another of the multiple quantum wells, it is possible to enhance characteristics of the device, for example, reduce a half-value width of an emission wavelength peak. Further, according to the method of fabricating a semiconductor light emitting device, it is possible to fabricate a semiconductor light emitting device having excellent characteristics.

BRIEF DESCRIPTION OF THE DRAWINGS

These and other objects, features and advantages of the present invention will be apparent from the following description taken in connection with the accompanying drawings wherein:

FIGS. 2A to 2E are schematic sectional views showing one example of a process of fabricating a semiconductor light emitting device according to the present invention, wherein FIG. 2A shows a step of forming an underlying growth layer, FIG. 2B shows a step of forming a mask layer, FIG. 2C shows a step of forming a crystal growth layer by selective growth, FIG. 2D shows a step of growing crystal on a mask layer, and FIG. 2E shows a step of forming an active layer and a p-type GaN layer by selective growth;

FIGS. 3A and 3B are typical views showing the supplied state of a source gas at the time of selective growth of an active layer, wherein FIG. 3A shows the supplied state of the source gas in the case where any crystal has not been grown on a mask, and FIG. 3B shows the supplied state of the source gas in the case where crystal has been grown on the mask;

DETAILED DESCRIPTION OF THE PREFERRED EMBODIMENTS

Hereinafter, a selective growth method, and a semiconductor light emitting device and a fabrication method thereof, to each of which the present invention is applied, will be described in detail with reference to the drawings.

The selective growth of an active layer according to the present invention will be described by example of a process of fabricating a semiconductor light emitting device having a structure shown in FIGS. 1A and 1B.

Figure 1A:
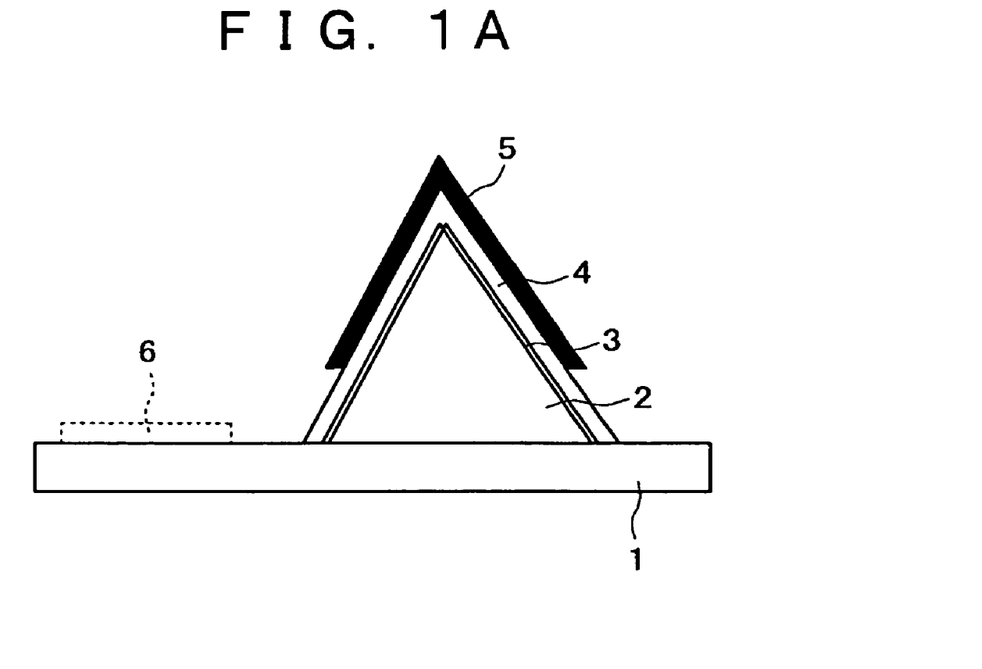
FIGS. 1A and 1B are a schematic sectional view and a schematic plan view showing one example of a semiconductor light emitting device, respectively.
Figure 1B:
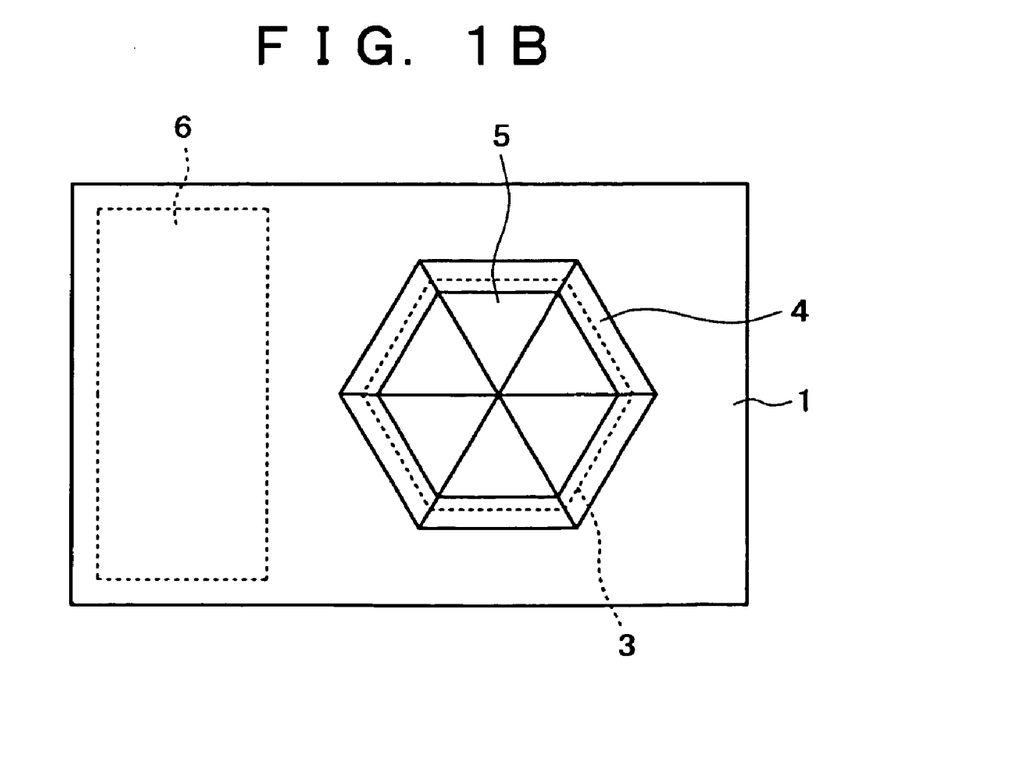

FIGS. 1A and 1B are a sectional view and a plan view showing the structure of a semiconductor light emitting device as one example of a device to which the fabrication process of the present invention is applied, respectively.

The light emitting device shown in the figures is exemplified by a GaN based light emitting diode, which is formed by crystal growth on, for example, a sapphire substrate. Such a GaN based light emitting diode formed on the sapphire substrate has a feature that it can be easily peeled from the sapphire substrate by laser irradiation. More specifically, when an interface between the sapphire substrate and a GaN based growth layer of the GaN based light emitting diode is irradiated with laser beams passing through the sapphire substrate, laser abrasion occurs at the interface, to cause film peeling at the interface by a phenomenon that nitrogen (N) of GaN is vaporized.

The GaN based light emitting diode shown in the figures has a structure that a hexagonal pyramid shaped GaN layer 2 is formed by selective crystal growth on an underlying growth layer 1 made from a GaN based semiconductor. While not shown, an insulating film having an opening is formed as a mask on the underlying growth layer 1, and the hexagonal pyramid shaped GaN layer 2 is formed by selective crystal growth from the opening of the insulating film by an MOCVD process or the like. If the C-plane of sapphire is used as the principle plane of the sapphire substrate for forming the GaN layer 2 thereon by crystal growth, the GaN layer 2 becomes a growth layer having a pyramid shape covered with an S-plane, that is, (1-101) plane. The GaN layer 2 is a region doped with silicon. The tilt S-plane portion of the GaN layer 2 functions as a cladding portion of a double-hetero structure.

An active layer 3 made from InGaN is formed so as to cover the tilt S-plane of the GaN layer 2. The active layer 3 may be a single layer, or a layer having a multi-quantum well (MQW) structure.

The fabrication process according to the present invention can be advantageously applied to the GaN based light emitting diode, if the diode includes the active layer 3 having the MQW structure.

The active layer 3 having the MQW structure may be formed, for example, by repeatedly stacking units each having an InGaN layer as a quantum well and an GaN layer containing no indium (In) as a barrier. The thickness of each of the quantum well and the barrier may be suitably selected (in general, to about several nm), and the number of times of repeated stacking may be suitably selected.

A GaN layer 4 doped with magnesium is formed on the outer surface of the active layer 3. The GaN layer 4 doped with magnesium also functions as a cladding portion.

The light emitting diode has a p-electrode 5 and an n-electrode 6. A metal material such as Ni/Pt/Au or Ni(Pd)/Pt/Au is vapor-deposited on the GaN layer 4 doped with magnesium, to form the p-electrode 5. A metal material such as Ti/Al/Pt/Au is vapor-deposited in an opening formed in the above-described insulating film (not shown), to form the n-electrode 6. In the case of extracting an n-electrode from the back surface side of the underlying growth layer 1, it is not required to form the n-electrode 6 on the front surface side of the underlying growth layer 1.

The process of fabricating the above-described semiconductor light emitting device will be described below.

Figure 2A:
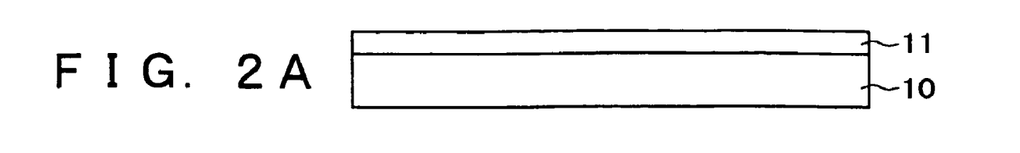

As shown in FIG. 2A, an n-type GaN layer 11 is formed as an underlying growth layer on a growth substrate 10 such as a sapphire substrate by, for example, an MOCVD process.

The n-type GaN layer 11 is not required to be n-type conductive as a whole, but may be n-type conductive only at its uppermost surface. As one example, the n-type GaN layer 11 can be formed by doping silicon in a GaN layer.

Figure 2B:
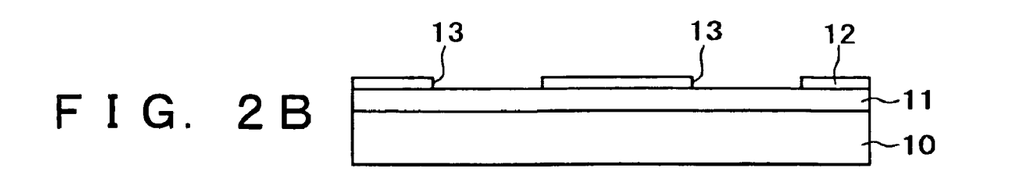

As shown in FIG. 2B, a mask layer 12 as an anti-growth film made from silicon oxide, silicon nitride, or tungsten is formed overall on the n-type GaN layer 11 by, for example, a CVD process, and a plurality of hexagonal window regions 13 are formed at positions, corresponding to those of device formation regions, of the mask layer 12.

Figure 2C:
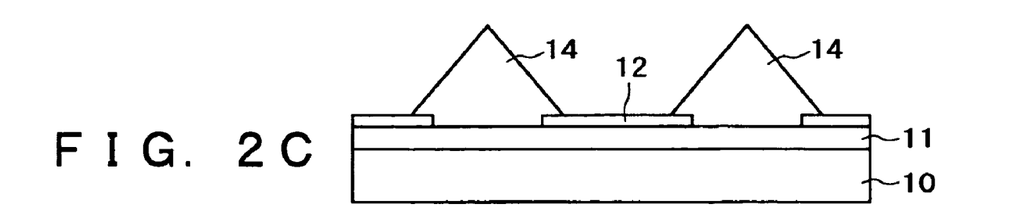

As shown in FIG. 2C, an n-type GaN layer 14 as a crystal growth layer is formed by selective crystal growth from each of the window regions 13. The n-type GaN layer 14 formed into an approximately hexagonal pyramid shape functions as a cladding layer. The tilt side plane of the n-type GaN layer 14 is an S-plane.

An active layer made from InGaN and a p-type GaN layer are sequentially stacked on the tilt side plane of the n-type GaN layer 14.

Figure 2D:
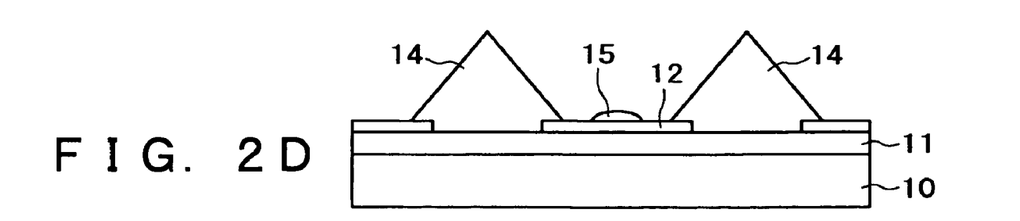

According to the fabrication process of the present invention, however, prior to the formation of the active layer, as shown in FIG. 2D, crystal 15 is grown in the polycrystalline form on a portion, on which the n-type GaN layer 14 is not formed by crystal growth, of the surface of the mask layer 12.

The growth of the crystal 15 may be performed as follows: namely, the same source gas as that used for the GaN layer 14 is used, and the condition of crystal growth of GaN for forming the GaN layer 14 is changed to allow crystal growth of GaN on the mask layer 12. The condition to allow crystal growth of GaN on the mask layer 12 may be set such that the carrier gas is changed into nitrogen gas at the time of crystal growth of GaN by the MOCVD process, or the growth temperature is lowered at the time of crystal growth of GaN by the MOCVD process.

Figure 2E:
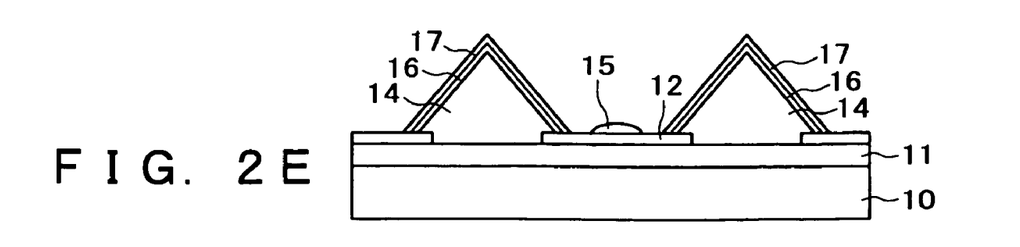

After the crystal 15 is thus grown on the mask layer 12, as shown in FIG. 2E, an active layer 16 made from InGaN and a p-type GaN layer 17 are sequentially formed by crystal growth on the S-plane of the n-type GaN layer 14. At this time, the active layer 16 extends along the tilt S-plane of the GaN layer 14 as the crystal growth layer, and therefore, it is not in parallel to the principal plane of the growth substrate 10 but is tilted therefrom. As a result, the area of the active layer 16 becomes sufficiently larger than each of the area of the window region 13 and the projected area of the GaN layer 14 as the crystal growth layer.

In the above-described fabrication process, it is important to grow the crystal 15 on the mask layer 12 prior to crystal growth of the active layer 16. The previous growth of the crystal 15 on the mask layer 12 makes it possible to eliminate a difference in film thickness between the initial stage and the later stage of crystal growth, more specifically, a difference between the thickness of a quantum well (or barrier) of the active layer 16 formed in the initial stage and the thickness of a quantum well (or barrier) of the active layer 16 formed in the later stage.

Figure 3A:
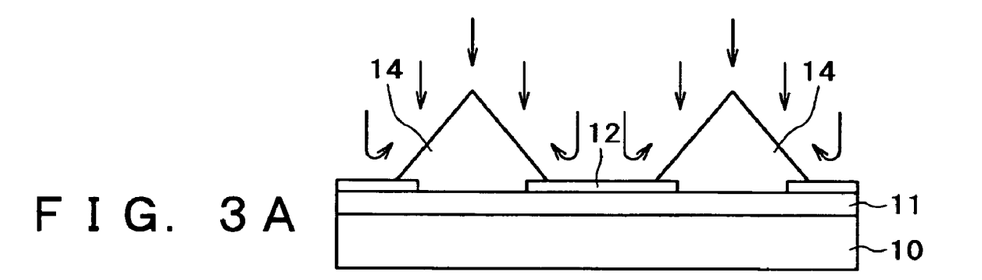
Figure 3B:
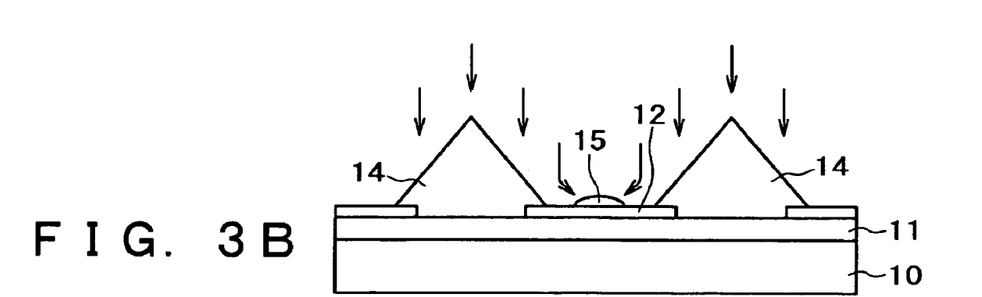

FIGS. 3A and 3B typically show how the supply state of a source gas differs depending on the presence or absence of the crystal 15.

If any crystal 15 is not formed on the mask layer 12, in the initial stage of crystal growth of the active layer 16, as shown in FIG. 3A, a source gas having been supplied to the mask layer 12 as the non-growth region flows in the direction shown by arrows, to contribute to crystal growth of the active layer 16 on the S-plane of the GaN layer 14. Accordingly, in the initial stage of crystal growth of the active layer 16, the amount of the source gas contributing to crystal growth of the active layer 16 becomes large. Meanwhile, as the crystal growth of the active layer 16 proceeds, crystal 15 begins to grow on the mask layer 12. Consequently, as shown by arrows in FIG. 3B, the source gas having been supplied to the mask layer 12 as the non-growth region is used for crystal growth of the crystal 15 or adsorbed on the crystal 15, and thereby not supplied to the S-plane of the GaN layer 14. Accordingly, in the later stage of crystal growth of the active layer 16, the amount of the source gas contributing to crystal growth of the active layer 16 becomes small. Such a difference in supplied amount of the source gas between the initial stage and the later stage of crystal growth leads to a difference between the thickness of a quantum well (or barrier) of the active layer 16 in the initial stage and the thickness of a quantum well (or barrier) of the active layer 16 in the later stage.

On the contrary, according to the fabrication process of the present invention, since the crystal 15 is grown on the mask layer 12 prior to crystal growth of the active layer 16, the supplied state of the source gas can be kept as that shown in FIG. 3B throughout the entire period from the initial stage to the later stage of crystal growth. As a result, the supplied amount of the source gas to the S-plane of the GaN layer 14 can be kept nearly constant, to eliminate the difference in thickness of the active layer 16 between the initial stage and the later stage of crystal growth.

The present inventors have made experiments to prove the above-described effect. In the experiments, the active layer 16 having a multi-quantum well (MQW) structure was formed by alternately stacking five quantum wells (InGaN) and five barriers (GaN), and the thickness distribution of the quantum wells and the barriers of the active layer 16 was measured.

Table 1 shows the thickness distribution of quantum wells and barriers of the active layer 16 formed under the condition that any crystal 15 is not grown on the mask layer 12 prior to formation of the active layer 16 according to the related-art method.

Figure 4:
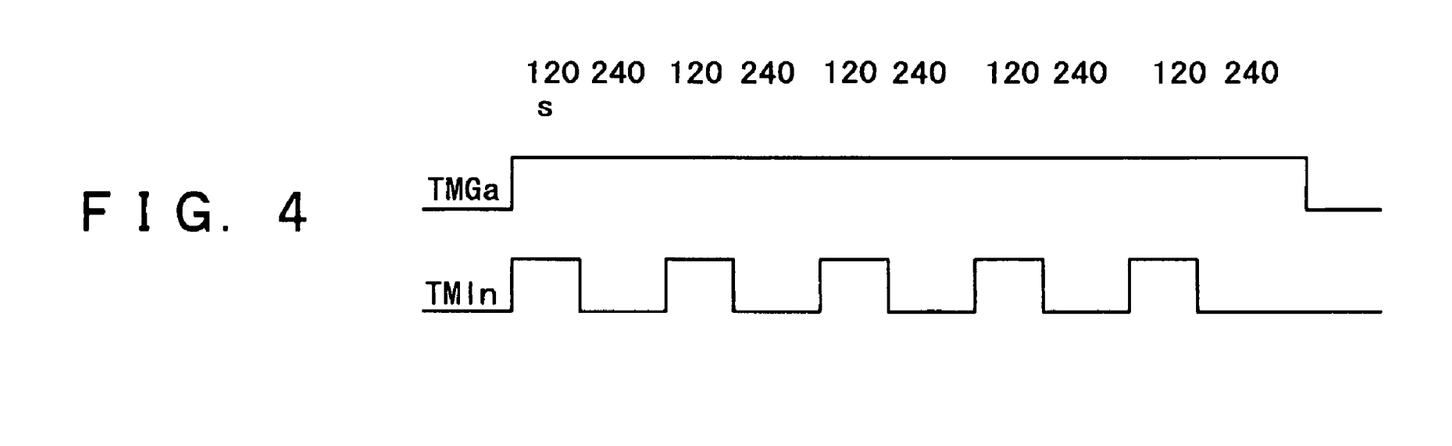
FIG. 4 is a timing chart with which a source gas is supplied in accordance with a related art method.

In formation of the active layer 16, the source gas [trimethyl Ga (TMGa) and trimethyl In (TMIn)] was supplied with a timing shown in FIG. 4, and each quantum well (QW) was formed by crystal growth at 750° C.

In this experiment, as shown in Table 1, the thickness of each of the quantum well and the barrier is gradually reduced in the later stage. For example, there is a difference of 0.5 nm between the thickness of the first quantum well and the thickness of the fifth quantum well.

TABLE 1

|  | 1st Quantum Well | 1st Barrier | 2nd Quantum Well | 2nd Barrier | 3rd Quantum Well | 3rd Barrier | 4th Quantum Well | 4th Barrier | 5th Quantum Well | 5th Barrier |
| --- | --- | --- | --- | --- | --- | --- | --- | --- | --- | --- |
| Film Thickness (nm) | 3.0 | 5.0 | 2.7 | 4.8 | 2.6 | 4.5 | 2.5 | 4.3 | 2.5 | 4.3 |

Table 2 shows the thickness distribution of quantum wells and barriers of the active layer 16 formed under the condition that the crystal 15 is grown on the mask layer 12 prior to formation of the active layer 16 according to the fabrication method of the present invention.

Figure 5:
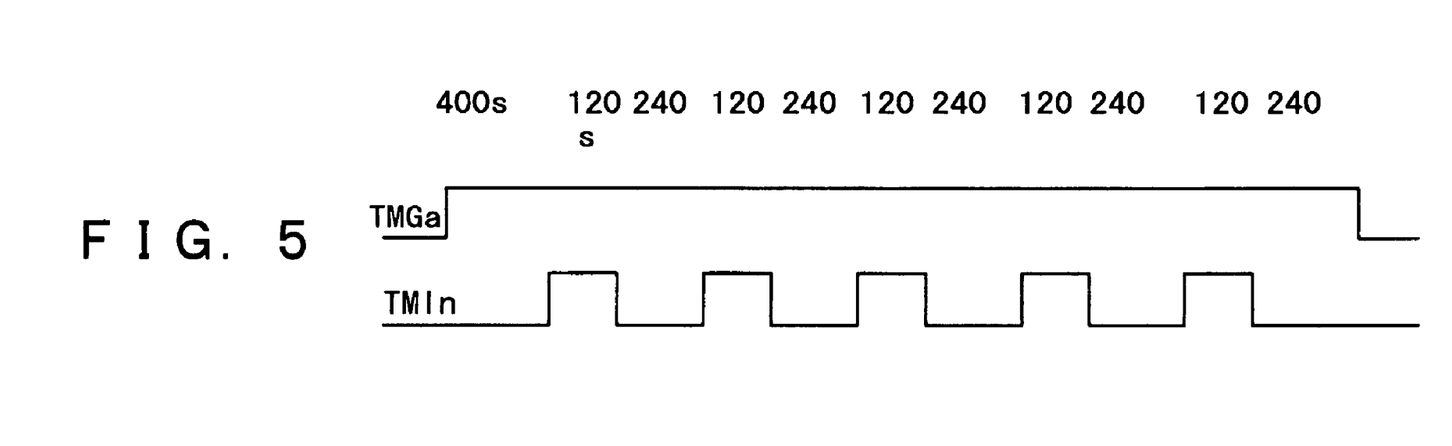
FIG. 5 is a timing chart with which a source gas is supplied in accordance with a selective growth method of the present invention.

In formation of the active layer 16, the source gas [trimethyl Ga(TMGa) and trimethyl In (TMIn)] was supplied with a timing shown in FIG. 5, and the crystal 15 was grown on the mask layer 12 in the initial period of 400 seconds. Like the previous experiment, each quantum well (QW) was formed by crystal growth at 750° C.

In this experiment, as shown in Table 2, the thickness of each of the quantum well and the barrier is little reduced even in the later stage. As a result, it becomes apparent that the reduction in thickness of the active layer 16 in the later stage of crystal growth can be certainly suppressed.

In general, the sapphire substrate with the C-plane of sapphire taken as the principal plane thereof has been often used to grow a gallium nitride (GaN) based compound semiconductor thereon. It is to be noted that the C-plane of sapphire taken as the principal plane of the sapphire substrate is not limited to the theoretical C-plane but may be a plane tilted from the theoretical C-plane by an angle 5 to 6 degrees.

The substrate may not be a constituent of a light-emitting device as a product. In other words, the substrate may be used merely to hold a device portion and be removed before the device is accomplished.

The crystal layer formed on the substrate has a tilt crystal plane tilted from the principal plane of the substrate. The crystal layer is not particularly limited insofar as it allows a light-emitting region (to be described later) composed of a first conductive type layer, an active layer, and a second

TABLE 2

|  | 1st Quantum Well | 1st Barrier | 2nd Quantum Well | 2nd Barrier | 3rd Quantum Well | 3rd Barrier | 4th Quantum Well | 4th Barrier | 5th Quantum Well | 5th Barrier |
| --- | --- | --- | --- | --- | --- | --- | --- | --- | --- | --- |
| Film Thickness (nm) | 2.5 | 4.2 | 2.4 | 4.2 | 2.5 | 4.1 | 2.4 | 4.0 | 2.4 | 4.1 |

The present invention will be hereinafter more fully described by example of the following semiconductor light emitting device, wherein the selective growth method of the present invention is applied to crystal growth of an active layer of the semiconductor light emitting device.

It is to be noted that the following semiconductor light emitting device is for illustrative purposes only, and therefore, the present invention is not limited thereto.

The semiconductor light emitting device to which the present invention is applied is represented by a semiconductor light emitting device fabricated by forming, on a substrate, a crystal layer having a tilt crystal plane (for example, S-plane) tilted from the principal plane of the substrate, and sequentially forming a first conductive type layer, an active layer, and a second conductive type layer in such a manner that each of these layers extends within a plane parallel to the tilt crystal plane of the crystal layer.

The substrate used herein is not particularly limited insofar as it allows a crystal layer having a tilt crystal plane tilted from the principal plane of the substrate to be formed thereon, and may be selected from various substrates, for examples, substrates made from sapphire ($Al_2O_3$, having A-plane, R-plane, or C-plane), SiC (including 6H, 4H, and 3C), GaN, Si, ZnS, ZnO, AlN, LiMgO, GaAs, $MgAl_2O_4$, and InAlGaN. Of these substrates, hexagonal or cubic crystal based substrates are preferred, with the hexagonal substrates being most preferred.

In the case of using a sapphire substrate, the C-plane of sapphire may be taken as the principal plane of the substrate.

conductive type layer to be form on a plane parallel to the tilted crystal plane, tilted from the principal plane of the substrate, of the crystal layer. In general, the crystal layer is preferably made from a material having a wurtzite type crystal structure.

For example, such a crystal layer may be made from a material selected from a group III based compound semiconductor, a BeMgZnCdS based compound semiconductor, a BeMgZnCdO based compound semiconductor, a gallium nitride (GaN) based compound semiconductor, an aluminum nitride (AlN) based compound semiconductor, an indium nitride (InN) based compound semiconductor, an indium gallium nitride (InGaN) based compound semiconductor, and an aluminum gallium nitride (AlGaN) based compound semiconductor. Of these materials, a nitride semiconductor such as a gallium nitride based compound semiconductor is preferably used as the material for forming the crystal layer.

It is to be noted that according to the present invention, the nitride semiconductor expressed by InGaN, AlGaN, or GaN does not necessarily mean only InGaN, AlGaN, or GaN in the form of a strict ternary or binary mixed crystal. For example, the nitride semiconductor expressed by InGaN may contain a trace amount of Al and other impurities which do not affect the function of InGaN without departing from the scope of the present invention.

The crystal layer can be formed by a chemical vapor deposition process selected, for example, from a metal organic chemical vapor deposition (MOCVD) process including a metal organic vapor phase epitaxy (MOVPE)

process, a molecular beam epitaxy (MBE) process, and a hydride vapor phase epitaxy (HVPE) process. In particular, the MOCVD process is preferred because it rapidly yields a crystal layer with a desirable crystallinity. The MOCVD method commonly employs alkyl metal compounds, such as TMG (trimethylgallium) or TEG (triethylgallium) as a Ga source, TMA (trimethylaluminum) or TEA (triethylaluminum) as an Al source, and TMI (trimethylindium) or TEI (triethylindium) as an In source. It also employs ammonia gas or hydrazine gas as a nitrogen source, and other gases as an impurity source, for example, silane gas for Si, germane gas for Ge, $Cp_2Mg$ (cyclopentadienylmagnesium) for Mg, and DEZ (diethylzinc) for Zn. In the general MOCVD process, the gases are fed to the surface of the substrate heated at about 600° C. or more, and are decomposed to form a layer of an InAlGaN based compound semiconductor by epitaxial growth.

It is preferred to form an underlying growth layer on the substrate and to form the crystal layer on the underlying growth layer.

The underlying growth layer can be formed by the same chemical vapor deposition process as that used for forming the crystal layer, for example, the metal organic chemical vapor deposition (MOCVD) process, molecular beam epitaxy (MBE) process, or hydride vapor phase epitaxy (HVPE) process.

The underlying growth layer may be made from, for example, gallium nitride or aluminum nitride, and may have a structure composed of a combination of a low-temperature buffer layer and a high-temperature buffer layer, or a combination of a buffer layer and a crystal seed layer functioning as a crystal seed.

The above structure of the underlying growth layer will be described in detail below.

If the crystal layer is formed by crystal growth from a low-temperature buffer layer, there occurs a problem that polycrystals tend to be deposited on the mask layer. To solve such a problem, a high-temperature buffer layer may be formed on the low-temperature buffer layer and then the crystal layer be formed thereon so as to be grown along a plane different from the principal plane of the substrate. With this configuration, the crystal layer with a desirable crystallinity can be formed by crystal growth.

In the case of using no crystal seed layer at the time of forming the crystal layer, the crystal layer is required to be formed by selective crystal growth from a buffer layer. At this time, however, there occurs a problem that crystal growth is liable to occur even in an anti-growth region where the crystal growth is not required. To solve such a problem, a crystal seed layer may be formed on the buffer layer and the crystal layer be formed by selective crystal growth from the crystal seed layer. With this configuration, the crystal layer can be selectively formed in a region where the crystal growth is required.

The low-temperature buffer layer is intended to relieve lattice mismatch between the substrate and a nitride semiconductor. Accordingly, if the substrate has a lattice constant close to or identical to that of a nitride semiconductor, the low-temperature buffer layer is not necessarily provided. For example, an AlN layer may be grown on an SiC substrate as a high-temperature buffer layer without lowering the growth temperature, and an AlN or GaN layer may be grown on an Si substrate as a high-temperature buffer layer without lowering the growth temperature. Even in this case, a GaN layer with a desirable crystallinity can be formed by crystal growth on the buffer layer. Additionally, in the case of using a GaN substrate, the structure without any buffer layer may be adopted.

In fabrication of the semiconductor light emitting device according to this embodiment, the crystal layer having a tilt crystal plane tilted from the principal plane of the substrate is formed by using the selective growth process.

The tilt crystal plane, tilted from the principal plane of the substrate, of the crystal layer is grown depending on the kind of the principal plane of the substrate.

If the crystal layer is grown on the (0001) plane [C-plane] as the principal plane of the substrate having the wurtzite type crystal structure, the tilt crystal plane of the crystal layer becomes one selected from the (1-100) plane [M-plane], the (1-101) plane [S-plane], the (11-20) plane [A-plane], the (1-102) plane [R-plane], the (1-123) plane [N-plane], the (11-22) plane, and crystal planes equivalent thereto. In particular, it is preferred to grow the crystal layer with the S-plane or the (11-22) plane, or the crystal plane equivalent thereto. It is to be noted that the crystal plane equivalent to the S-plane or the (11-22) plane is the crystal plane tilted from the S-plane or the (11-22) plane by an angle of 5 to 6 degrees.

In particular, the S-plane is a stable plane selectively grown on the $C^+$-plane and is therefore relatively obtainable. The S-plane is expressed by the (1-101) plane in accordance with Miller indices of a hexagonal crystal system. Just as the C-plane includes the $C^+$-plane and the $C^-$-plane, the S-plane includes the $S^+$-plane and the $S^-$-plane. In this specification, the $S^+$-plane is grown on the $C^+$-plane of GaN, and it is referred to as the S-plane unless otherwise stated. Of the S-planes, the $S^+$-plane is stable. In addition, the Miller index of the $C^+$-plane is (0001).

In the case of growing the S-plane of the crystal layer made from a gallium nitride based compound semiconductor on the $C^+$-plane of the substrate as described above, the number of bonds from Ga to N on the S-plane is 2 or 3, which number is second to that on the C-plane. Since the $C^-$-plane cannot be grown on the $C^+$-plane in practice, the number of bonds on the S-plane is the largest.

In the case of growing a wurtzite type nitride, for example, GaN based nitride on a sapphire substrate with the C-plane of sapphire taken as the principal plane thereof, if the selective growth process is not used to grow the nitride, the surface of the nitride is grown as the $C^+$-plane, whereas if the selective growth process is used to grow the nitride, the surface of the nitride can be grown as the S-plane tilted from the C-plane of the sapphire substrate.

On the $C^+$-plane, parallel to the C-plane of the substrate, of the nitride, the bond of N liable to be easily released from the plane combines with one bond of Ga, whereas on the S-plane, tilted from the C-plane of the substrate, of the nitride, the bond of N combines with at least one bond of Ga.

As a result, the V/III ratio of the nitride grown along the S-plane can be effectively increased, to advantageously improve the crystallinity of the laminated structure. In addition, according to the formation of the nitride by the selective growth process, since nitride is grown along the S-plane different from the orientation of the substrate, dislocations extending upwardly from the substrate may be bent, to advantageously reduce crystal defects of the nitride.

In the semiconductor light emitting device according to this embodiment, as described above, the crystal layer has a tilt crystal plane tilted from the principal plane of the substrate.

The structure of the crystal layer will be more fully described below.

The crystal layer may have an approximately hexagonal pyramid shape in which the tilt plane forming the pyramid shape is composed of the S-plane or a plane substantially equivalent thereto. Alternatively, the crystal layer may have a so-called approximately hexagonal truncated pyramid shape in which the tilt plane of the truncated pyramid shape is composed of the S-plane or a plane substantially equivalent thereto, and the upper flat plane of the truncated pyramid shape is composed of the C-plane or a plane substantially equivalent thereto.

Each of the approximately hexagonal pyramid shape and the approximately hexagonal truncated pyramid shape is not necessarily a perfect hexagonal shape but may be an imperfect hexagonal shape with one or more missing faces.

In a preferred embodiment, the tilt crystal plane is hexagonal and is arranged so as to be approximately symmetrical. The term "approximately symmetrical" used herein embraces not only completely symmetrical but also slightly asymmetrical.

The ridge between adjacent two crystal plane segments of the crystal layer is not necessarily a straight line. Also, each of the approximately hexagonal pyramid shape and the approximately hexagonal truncated pyramid shape may extend in straight line.

The concrete selective growth process used for selectively growing the crystal layer will be described below.

The selective growth of the crystal layer is performed by making use of a selectively removed portion of the underlying growth layer, or by making use of a selectively formed opening in a mask layer which is formed on or under the underlying growth layer.

For example, if the underlying growth layer is composed of a buffer layer and a crystal seed layer, the crystal seed layer is formed on the buffer layer in such a manner as to be divided into scattered small regions each having a diameter of about 10 μm, and the crystal layer having the S-plane or the like is formed by crystal growth from each of the small regions. For example, the divided regions of the crystal seed layer may be arranged so as to be spaced from each other at intervals of a value equivalent of a margin for separation of adjacent light emitting devices. The divided small region may be formed into a shape selected from a stripe, a lattice, a circle, a square, a hexagon, a triangle, a rectangle, a rhombus, and other shapes deformed therefrom.

The selective growth of the crystal layer may be performed by forming a mask layer on the underlying growth layer, and selectively forming window regions in the mask layer. The mask layer may be made from silicon oxide or silicon nitride. The crystal layer having an approximately hexagonal truncated pyramid shape or an approximately hexagonal pyramid shape extending in straight line in one longitudinal direction as described above can be formed by selective crystal growth from each of stripe-shaped window regions formed in the mask layer or from each of stripe-shaped regions of the crystal seed layer.

By forming, in the mask layer, the window region of a circular shape (or a hexagonal shape whose one side extends along the (1-100) direction or (11-20) direction) having a size of around 10 μm, it is possible to easily form the crystal layer having a size of about twice as large as the window region by selective growth from the window region. In the crystal layer thus formed by selective growth, since the S-plane tilted from the principal plane of the substrate has an effect of bending and blocking dislocations extending from the substrate, it is possible to reduce the density of dislocations in the crystal layer.

The present inventors have made an experiment to examine characteristics of the S-plane of a semiconductor light emitting device.

A semiconductor light emitting device was prepared by forming a crystal layer of a hexagonal truncated pyramid shape having the S-plane by selective growth, and sequentially growing an InGaN active layer and a Mg-doped layer on the S-plane of the crystal layer.

With respect to such a semiconductor light emitting device, the state of each layer grown along the S-plane was examined.

As a result of observation of the state of the S-plane by making use of cathode luminescence, it was revealed that the crystallinity of the S-plane is desirable, and therefore, the luminous efficiency on the S-plane is higher than that on the $C^+$-plane.

In particular, since the growth temperature of the InGaN active layer is in a range of 700 to 800° C., the decomposition efficiency of ammonia is low, with a result that the growth of the InGaN active layer requires a larger amount of nitrogen species. In this regard, the growth of the InGaN active layer on the S-plane is preferred. As a result of observation of the surface state of the S-plane by AFM (Atomic Force Microscopy), it was revealed that the surface state of the S-plane is a regular stepped state suitable for growth of InGaN thereon.

As a result of observation by AFM, it was also revealed that although the state of the growth surface of the Mg-doped layer is generally poor in the level observed by AFM, the Mg-doped layer can be grown along the S-plane while keeping a desirable surface state, and that the doping condition at the time of growth on the S-plane is quite different from that at the time of growth on a plane other than the S-plane.

The S-plane was further subjected to microscopic photoluminescence mapping having a resolving power of about 0.5 to 1 μm. The result showed that although the surface of the sample grown on the $C^+$-plane by the ordinary growth process has irregularities at a pitch of about 1 μm, the surface of the sample grown on the S-plane is uniform.

In addition, as a result of observation of SEM (scanning electron microscope), it was revealed that the flatness of the tilt plane of the layer grown on the S-plane obtained by the selective growth process is smoother than the flat plane of the layer grown along the $C^+$-plane obtained by the ordinary growth process.

In the case of forming a crystal layer by selective growth from a window region formed in a selective growth mask, the crystal layer is generally grown only in an area over the window region. In this case, to realize lateral growth of the crystal layer, there may be adopted a micro-channel epitaxy process. The use of the micro-channel epitaxy process allows the crystal layer to be laterally grown into a shape larger than the window region.

It is known that the lateral growth of the crystal growth by using the micro-channel epitaxy process is effective to prevent threading dislocations extending from the substrate from being propagated in the crystal layer and hence to reduce the density of dislocations in the crystal layer. The lateral growth of the crystal layer by using the micro-channel epitaxy process is also advantageous in increasing the light-emitting region, equalizing a current, avoiding concentration of current, and reducing the current density.

In the semiconductor light emitting device according to this embodiment, as described above, a crystal layer having a tilt crystal plane tilted from the principal plane of a substrate is formed, and a first conductive type layer, an active layer, and a second conductive type layer are sequentially formed on the crystal layer so as to extend within planes parallel to the tilt crystal plane, tilted from the principal plane of the substrate, of the crystal layer.

The first conductive type layer is a p-type or n-type cladding layer, and the second conductive type layer is an n-type or p-type cladding layer.

For example, in the case of forming the crystal layer having the S-plane by using a gallium nitride based compound semiconductor, the n-type cladding layer made from a silicon-doped gallium nitride based compound semiconductor may be formed on the S-plane of the crystal layer, an active layer made from InGaN be formed on the n-type cladding layer, and the p-type cladding layer made from magnesium-doped gallium nitride based compound semiconductor be formed on the active layer. The semiconductor light emitting device thus produced has a so-called doublehetero structure.

The active layer may have a structure that an InGaN layer be sandwiched between AlGaN layers. Also, the active layer may be of a single bulk layer structure, or a quantum well structure such as a single quantum well (SQW) structure, a double quantum well (DQW) structure, or multiple quantum well (MQW) structure. The quantum well structure uses a barrier layer for separation of quantum wells, if necessary.

The provision of the InGaN layer as the active layer is particularly advantageous in terms of easy fabrication of the light emitting device and improvement of light emission characteristics of the light emitting device. The InGaN layer grown on the S-plane is further advantageous in that since the S-plane has a structure that nitrogen atoms are less releasable, the crystallization of InGaN on the S-plane is particularly easy and the crystallinity of InGaN formed on the S-plane is desirable.

Additionally, a nitride semiconductor has a property to become n-type conductive even in the non-doped state because of nitrogen holes occurring in crystal; however, the nitride semiconductor may be converted into an n-type semiconductor with a desirable concentration of carriers by doping an ordinary donor impurity such as Si, Ge, or Se during crystal growth of the nitride semiconductor.

A nitride semiconductor can be converted into a p-type semiconductor by doping an acceptor impurity such as Mg, Zn, C, Be, Ca, or Ba in crystal of the nitride semiconductor. In this case, to obtain a p-layer with a high carrier density, after being doped with the acceptor impurity, the nitride semiconductor may be activated, for example, by an annealing treatment performed at about 400° C. or more in an inert gas atmosphere such as a nitrogen or argon atmosphere. The activation of the nitride semiconductor may be performed by irradiating the nitride semiconductor with electron beams, microwaves, or light.

The first conductive type layer, the active layer, and the second conductive type layer can be easily formed on the crystal layer so as to extend within planes parallel to the tilt crystal plane, tilted from the principal plane of the substrate, of the crystal layer by continuously forming these layers on the tilt crystal plane of the crystal layer by crystal growth. If the crystal layer has an approximately hexagonal pyramid or approximately hexagonal truncated pyramid shape whose tilt crystal plane is the S-plane, the light emission region composed of the first conductive type layer, the active layer, and the second conductive type layer can be wholly or partially formed on the S-plane. If the crystal layer has an approximately hexagonal truncated pyramid shape, the first conductive type layer, the active layer, and the second conductive type can be formed even on an upper plane, parallel to the principal plane of the substrate, of the truncated pyramid shape.

In the case of forming the light emission region on the plane parallel to the principal plane of the substrate, light emitted from the light emission region is decayed by multiple reflection, whereas in the case of forming the light emission region on the tilt S-plane tilted from the principal plane of the substrate, light emitted from the light emission region can be emerged to the outside of the light emitting semiconductor device without occurrence of multiple reflection.

The first conductive type layer functioning as the cladding layer can be made from the same material as that of the crystal layer so as to have the same conductive type as that of the crystal layer. To be more specific, the first conductive type layer can be formed by continuing, after the crystal layer having the S-plane is formed, the crystal growth while continuously adjusting the concentration of the source gas. Alternatively, the first conductive type layer may be configured as part of the crystal layer having the S-plane. In addition, to improve the light emergence efficiency, the first conductive type layer may be formed on the plane not parallel to the principal plane of the substrate.

According to the semiconductor light emitting device in this embodiment, the luminous efficiency can be increased by making use of a desirable crystallinity of the tilt crystal plane, tilted from the principal plane, of the crystal layer. In particular, by injecting a current only into the S-plane having a desirable crystallinity, it is possible to enhance the luminous efficiency. This is because the InGaN active layer can be desirably formed on the S-plane having a desirable crystallinity. In addition, the actual area of the active layer extending within a plane being substantially parallel to the S-plane is larger than the area, projected on the principal plane of the substrate or the underlying growth layer, of the active layer. The enlarged area of the active layer makes it possible to increase the area of the light emission region of the device and thereby reduce the density of a current injected in the light emission region, and to reduce the saturated luminance and thereby increase the luminous efficiency.

With respect to the semiconductor light emitting device including the hexagonal pyramid shaped crystal layer having the tilt S-plane, the stepped state of the surface of a portion near the top of the S-plane becomes poor, so that the luminous efficiency at the top portion of the device is degraded.

To be more specific, when the S-plane section on one side of the hexagonal pyramid shape is divided into four regions (top region, left region, right region, and bottom region) with respect to a nearly central portion of the S-plane section, the stepped state is most wavy in the top region, whereby abnormal crystal growth is liable to occur in the top region. On the contrary, in each of the left and right regions, since steps extend nearly in straight line and are closely collected, the crystal growth state becomes desirable. In the bottom region, although steps are slightly wavy, crystal growth is not so abnormal as observed in the top region.

In the semiconductor light emitting device of the present invention, it is thus recommended that the injection of a current in the active layer be controlled such that the current density in the top region be smaller than that in each of the other regions. To make the current density in the top region small, an electrode may be formed not in the top region but in the side region, or a current blocking area be formed in the top region before an electrode is formed in the top region.

An electrode is formed on each of the crystal layer and the second conductive type layer. To reduce the contact resistance, a contact layer may be formed and then the electrode be formed thereon. In the case of forming these electrodes by vapor deposition, if the p-electrode and the n-electrode adhere on both the crystal layer and the crystal seed layer formed under the mask layer, there occurs short-circuit therebetween. To cope with such an inconvenience, each of the electrodes must be accurately formed by vapor deposition.

An image display unit or an illumination unit can be fabricated by arraying a plurality of the semiconductor light emitting devices according to the present invention. In this case, according to the semiconductor light emitting device of the present invention, the electrode area can be suppressed by making use of the S-plane, and accordingly, by preparing the semiconductor light emitting devices of three primary colors and arraying them in a scannable manner, an image display unit with a reduced electrode area can be realized.

The shape of the semiconductor light emitting device of the present invention can be variously changed as described below with reference to examples shown in FIGS. 6 to 10.

Figure 6:
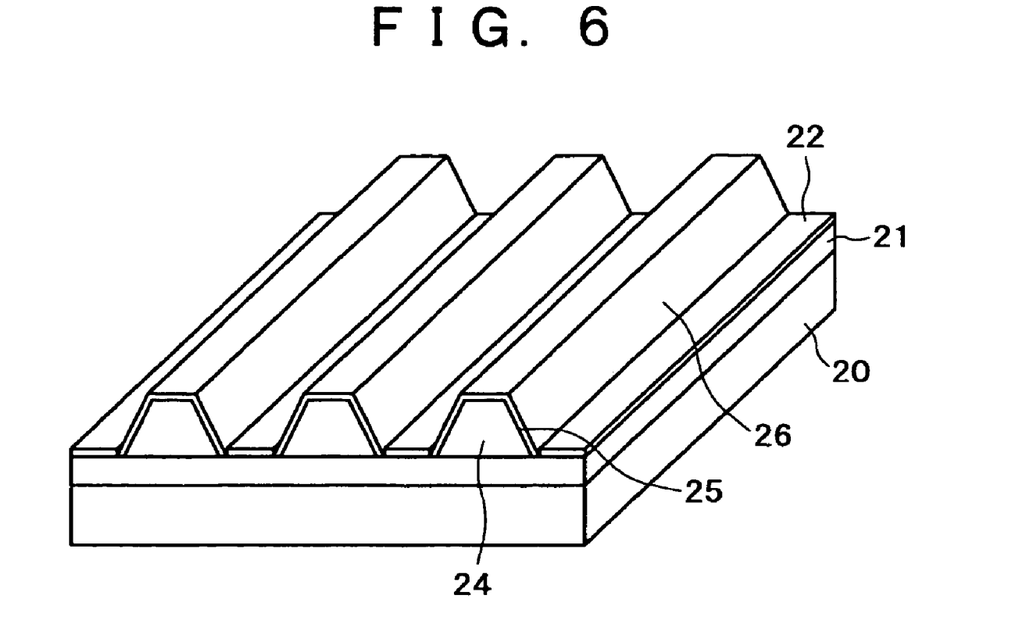
FIG. 6 is a schematic perspective view showing a first shape example of a semiconductor light emitting device of the present invention.

FIG. 6 shows a first example in which each stripe-shaped crystal growth layer is formed on a growth substrate. As shown in the figure, an underlying growth layer 21 is formed on a growth substrate 20, a mask layer 22 having window regions is formed on the underlying growth layer 21, and stripe-shaped crystal growth layers 24 are formed by selective crystal growth from the window regions. In the stripe-shaped crystal growth layer 24, both side surfaces 26 are each taken as the S-plane. An active layer 25 is formed on each crystal growth layer 24 in such a manner as to extend on both the tilt side surfaces 26 and an upper surface of the crystal growth layer 24. The area of the active area 25 is larger than the area, projected on the horizontal plane, of the crystal growth layer 24. As a result, it is possible to effectively relieve the saturated luminance and hence to improve the reliability of the device.

Figure 7:
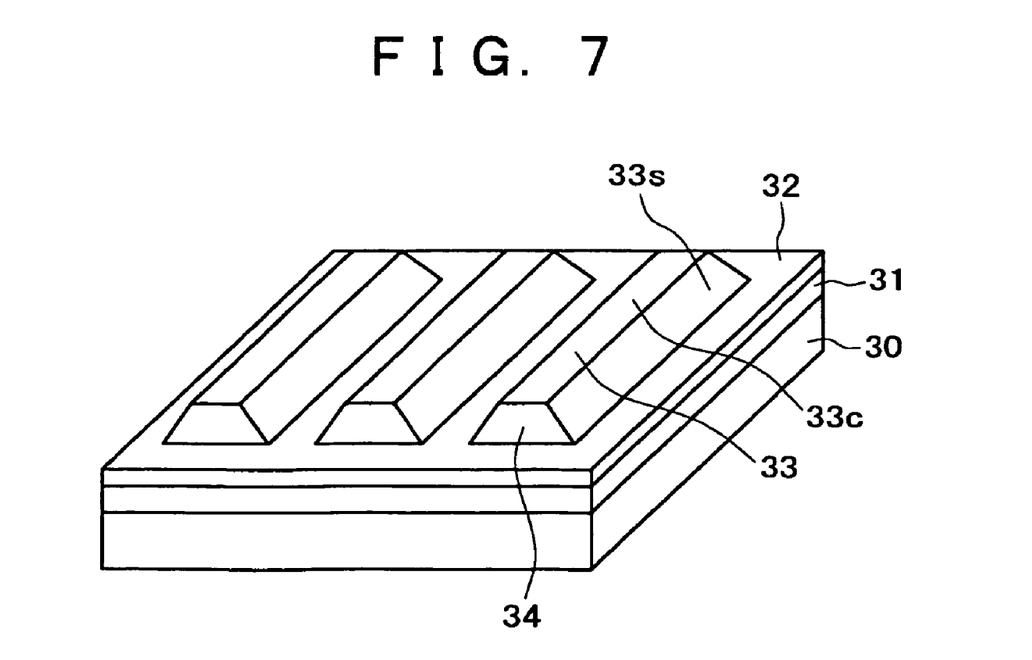
FIG. 7 is a schematic perspective view showing a second shape example of the semiconductor light emitting device of the present invention.

FIG. 7 shows a second example in which each rectangular trapezoidal crystal growth layer is formed on a growth substrate. As shown in the figure, an underlying growth layer 31 is formed on a growth substrate 30, a mask layer 32 having window regions is formed on the underlying growth layer 31, and stripe-shaped rectangular trapezoidal crystal growth layers 33 are formed by selective growth from the window regions. In the rectangular trapezoidal crystal growth layer 33, both side surfaces 33S are each taken as the S-plane, both longitudinal end surfaces 34 are each taken as the (11-22) plane, and an upper surface 33C is taken as the C-plane being the same as that of the principal plane of the growth substrate 30. While not shown, an active layer is formed on each crystal growth layer 33 in such a manner as to extend on the tilted side surfaces 33S, the end surfaces 34, and the upper surface 33C. The area of the active layer is larger than the area, projected on the horizontal plane, of the crystal growth layer 33. As a result, it is possible to effectively relieve the saturated luminance and hence to improve the reliability of the device.

Figure 8:
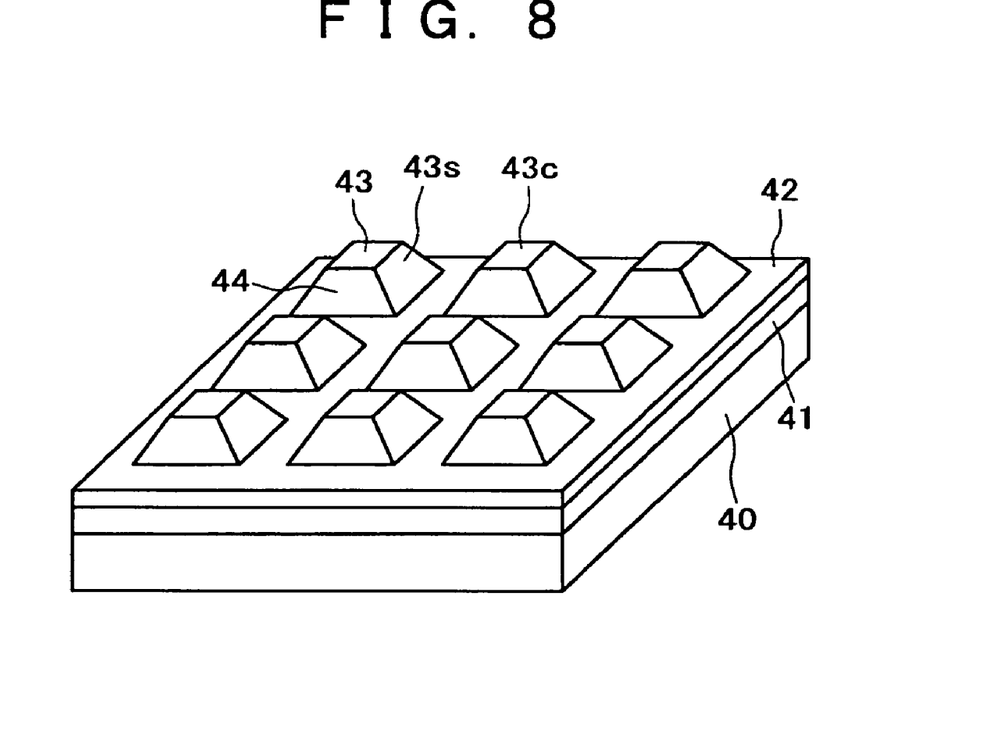
FIG. 8 is a schematic perspective view showing a third shape example of the semiconductor light emitting device of the present invention.

FIG. 8 shows a third example in which each square truncated pyramid shaped crystal growth layer is formed on a growth substrate. As shown in the figure, an underlying growth layer 41 is formed on a growth substrate 40, a mask layer 42 having window regions is formed on the underlying growth layer 41, and square truncated pyramid shaped crystal growth layers 43 are formed by selective crystal growth from the window regions in such a manner as to be arrayed in a matrix pattern. In the square truncated pyramid shaped crystal growth layer 43, a pair of opposed tilt side surfaces 43S are each taken as the S-plane, another pair of opposed tilt side surfaces 44 are each taken as the (11-22) plane, and an upper surface 43C is taken as the C-plane being the same as that of the principal plane of the growth substrate 40. While not shown, an active layer is formed on each crystal growth layer 43 in such a manner as to extend on the tilted side surfaces 43S and 44, and the upper surface 43C. The area of the active layer is larger than the area, projected to horizontal plane, of the crystal growth layer 43. As a result, it is possible to effectively relieve the saturated luminance and hence to improve the reliability of the device.

Figure 9:
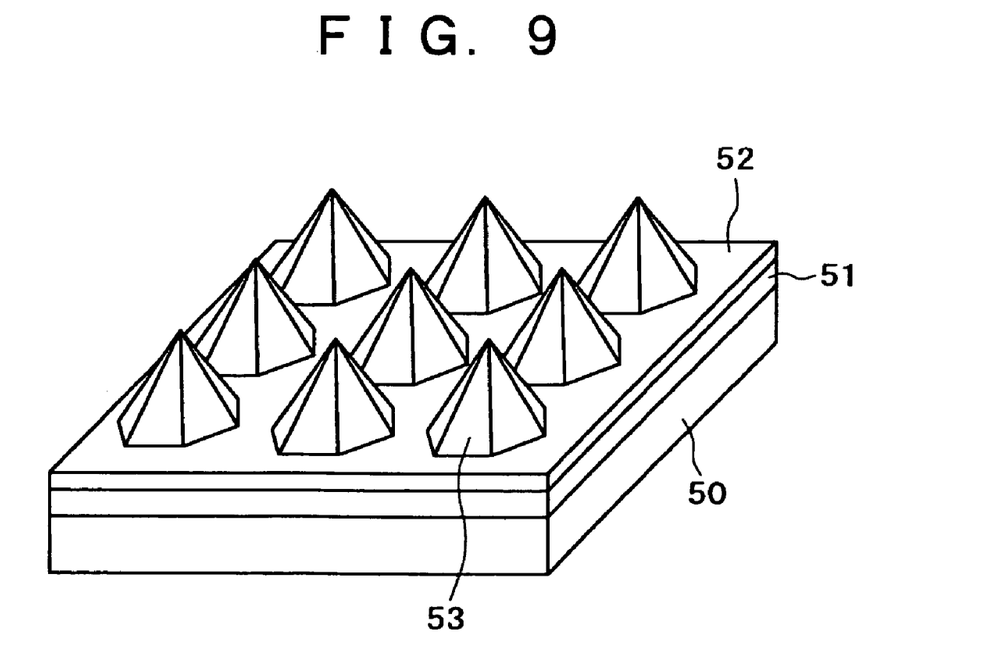
FIG. 9 is a schematic perspective view showing a fourth shape example of the semiconductor light emitting device of the present invention.

FIG. 9 shows a fourth example in which each hexagonal pyramid shaped crystal growth layer is formed on a growth substrate. As shown in the figure, an underlying growth layer 51 is formed on a growth substrate 50, a mask layer 52 having window regions is formed on the underlying growth layer 51, and hexagonal pyramid shaped crystal growth layers 53 are formed by selective crystal growth from the window regions in such a manner as to be arrayed in a matrix pattern. In the hexagonal pyramid shaped crystal growth layer 53, side surfaces are each taken as the S-plane. While not shown, an active layer is formed on each crystal growth layer 53 in such a manner as to extend on the tilt S-planes. The area of the active layer is larger than the area, projected to horizontal plane, of the crystal growth layer 53. As a result, it is possible to effectively relieve the saturated luminance and hence to improve the reliability of the device.

Figure 10:
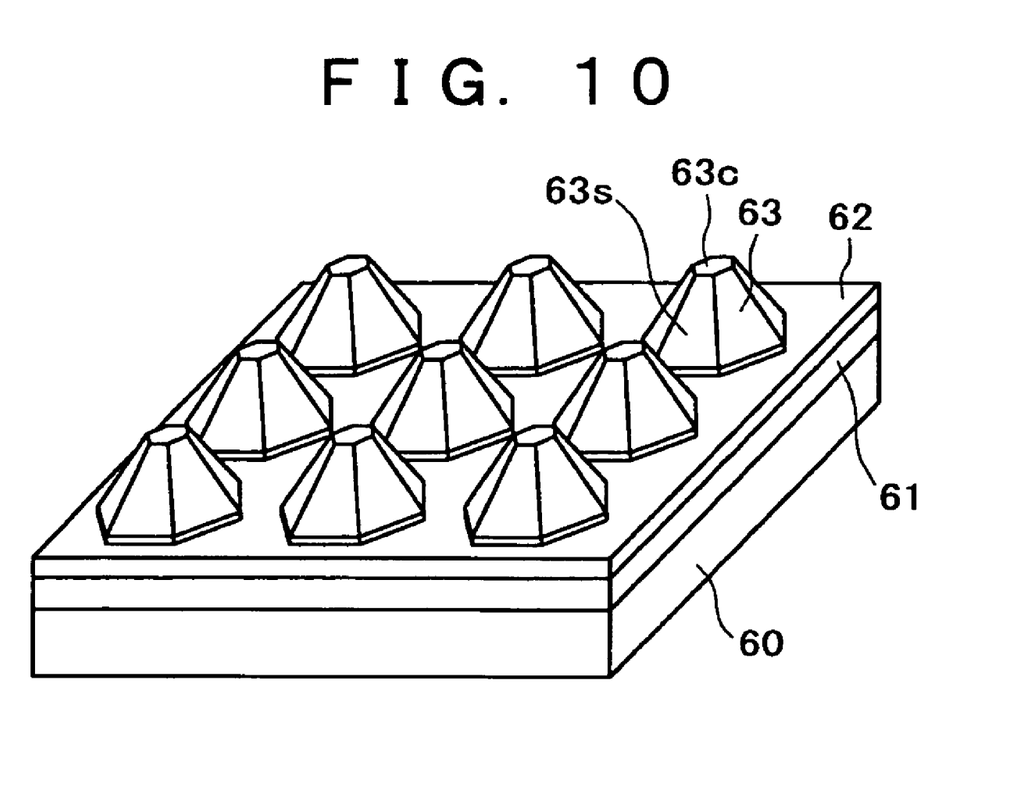
FIG. 10 is a schematic perspective view showing a fifth shape example of the semiconductor light emitting device of the present invention.

FIG. 10 shows a fifth example in which each hexagonal truncated pyramid shaped crystal growth layer is formed on a growth substrate. As shown in the figure, an underlying growth layer 61 is formed on a growth substrate 60, a mask layer 62 having window regions is formed on the underlying growth layer 61, and hexagonal truncated pyramid shaped crystal growth layers 63 are formed by selective crystal growth from the window regions in such a manner as to be arrayed in a matrix pattern. In the hexagonal truncated crystal growth layer 63, side surfaces 63S are each taken as the S-plane, and an upper surface 63C is taken as the C-plane being the same as that of the principal plane of the substrate. In addition, a small-height portion having the M-plane, that is, the (1-100) plane is also formed on the bottom surface side of the hexagonal truncated pyramid shaped crystal growth layer 63. While not shown, an active layer is formed on each crystal growth layer in such a manner as to extend on the tilt S-planes and the C-plane. The area of the active layer is larger than the area, projected to the horizontal plane, of the crystal growth layer 63. As a result, it is possible to effectively relieve the saturated luminance and hence to improve the reliability of the device.

As described above, according to the semiconductor light emitting device of the present invention, it is possible to keep the crystal growth rate of an active layer nearly at a constant value, and hence to eliminate a variation in thickness of the active layer and thereby solve the problem associated with the degradation of characteristics of the device. Further, it is possible to make the thickness of one of multiple quantum wells nearly equal to that of another of the multiple quantum wells, and hence to enhance light emission characteristics of the device, for example, reduce a half-value width of an emission wavelength peak.

While the preferred embodiments of the present invention have been described using the specific terms, such description is for illustrative purposes only, and it is to be understood that changes and variations may be made without departing from the spirit and scope of the following claims.

What is claimed is:

1. A method of fabricating a semiconductor light emitting device including a cladding layer, a guide layer, and an active layer, each of which is sequentially formed by selective growth, said method comprising the steps of:
    previously growing crystal in an active layer non-growth region; and growing said active layer in an active layer selective growth region,
    wherein said cladding layer, said guide layer, and said active layer are sequentially grown on a tilt growth plane of a nitride grown on a sapphire substrate through a mask having an opening.

2. A method of fabricating a semiconductor light emitting device according to claim 1, wherein said active layer has a multi-layer structure.

3. A method of fabricating a semiconductor light emitting device according to claim 1, wherein said active layer has multiple quantum wells.

4. A method of fabricating a semiconductor light emitting device according to claim 1, wherein said active layer is grown by an MOCVD process.

5. A method of fabricating a semiconductor light emitting device including a cladding layer, a guide layer, and an active layer, each of which is sequentially formed by selective growth, said method comprising the steps of:
    previously growing crystal in an active layer non-growth region; and growing said active layer in an active layer selective growth region wherein said active layer is grown by an MOCVD process, and
    wherein said crystal is grown on said non-growth region by changing a carrier gas into nitrogen gas in said MOCVD process.

6. A method of fabricating a semiconductor light emitting device including a cladding layer, a guide layer, and an active layer, each of which is sequentially formed by selective growth, said method comprising the steps of:
    previously growing crystal in an active layer non-growth region; and growing said active layer in an active layer selective growth region wherein said active layer is grown by an MOCVD process, and
    wherein said crystal is grown in said non-growth region by lowering a growth temperature in said MOCVD process.

* * * * *